US012581752B2

(12) United States Patent
Leuenberger et al.

(10) Patent No.: US 12,581,752 B2
(45) Date of Patent: Mar. 17, 2026

(54) IR PHOTODETECTOR WITH INTERCALATED GRAPHENE LAYER AND RELATED METHODS

(71) Applicant: UNIVERSITY OF CENTRAL FLORIDA RESEARCH FOUNDATION, INC., Orlando, FL (US)

(72) Inventors: Michael N. Leuenberger, Orlando, FL (US); Muhammad Waqas Shabbir, Orlando, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 493 days.

(21) Appl. No.: 18/333,634

(22) Filed: Jun. 13, 2023

(65) Prior Publication Data

US 2023/0402560 A1 Dec. 14, 2023

Related U.S. Application Data

(60) Provisional application No. 63/366,278, filed on Jun. 13, 2022.

(51) Int. Cl.
| | |
|---|---|
| *H10F 30/282* | (2025.01) |
| *G01J 5/02* | (2022.01) |
| *H10D 62/80* | (2025.01) |
| *H10F 77/12* | (2025.01) |
| *H10F 77/14* | (2025.01) |
| *H10F 77/16* | (2025.01) |

(52) U.S. Cl.
CPC ............ *H10F 30/282* (2025.01); *G01J 5/024* (2013.01); *H10F 77/12* (2025.01); *H10F 77/147* (2025.01); *H10F 77/16* (2025.01); *H10D 62/882* (2025.01)

(58) Field of Classification Search
CPC ...... H10F 30/282; H10F 77/12; H10F 77/147; H10F 77/16; G01J 5/024; H10D 62/882
See application file for complete search history.

(56) References Cited

U.S. PATENT DOCUMENTS

| | | |
|---|---|---|
| 9,406,872 B1 | 8/2016 | Annunziata et al. |
| 10,312,389 B2 | 6/2019 | Chanda et al. |
| | (Continued) | |

FOREIGN PATENT DOCUMENTS

WO WO2014111702 A2 7/2014

OTHER PUBLICATIONS

Zhan et al. "FeCl 3-Based Few-Layer Graphene Intercalation Compounds: Single Linear Dispersion Electronic Band Structure and Strong Charge Transfer Doping" Adv. Funct. Mater. 2010, 20, 3504-3509.

(Continued)

*Primary Examiner* — Matthew L Reames
(74) *Attorney, Agent, or Firm* — Allen, Dyer, Doppelt + Gilchrist, PA

(57) ABSTRACT

An IR photodetector detects IR radiation in a frequency range. The IR photodetector includes an electrically conductive layer, first and second vertical supports extending from the electrically conductive layer and defining a cavity therebetween and over the electrically conductive layer, and a transparent electrically conductive layer carried by the first and second vertical supports and over the cavity. The transparent electrically conductive layer defines a gate electrode. The IR photodetector also includes a detector layer over the transparent electrically conductive layer and having a perforated pattern. The detector layer has graphene layers intercalated with ferric chloride layers. The IR photodetector also includes first and second electrically conductive con- (Continued)

tacts carried by the transparent electrically conductive layer on opposite sides of the detector layer.

20 Claims, 18 Drawing Sheets

(56) References Cited

U.S. PATENT DOCUMENTS

| | | |
|---|---|---|
| 10,784,387 B2 | 9/2020 | Chanda et al. |
| 2012/0132930 A1 | 5/2012 | Young et al. |
| 2022/0035224 A1 | 2/2022 | Leuenberger et al. |
| 2022/0285442 A1 | 9/2022 | Saito et al. |

OTHER PUBLICATIONS

Chen et al. "Chloride-intercalated continuous chemical vapor deposited graphene film with discrete adlayers" Nano Research 2018, 11(1): 440-448.

Withers et al. "All-Graphene Photodetectors" ACSNANO: vol. 7 No. 6 5052-5057 2013.

Wang et al. "Modulation Doping via a 2d Atomic CrystallineAcceptor" Nano Lett. 2020, 20, 12, 8446-8452; pp. 22.

Li et al. "First-principles studyofelectronicandmagneticproperties of FeCl3-based graphiteintercalationcompounds" PhysicaB 425 (2013)72-77.

Reschke et al., "Electronic and phonon excitations in a-RuCl3" Phys. Rev. B 96, 165120; Published Oct. 11, 2017; Abstract Only.

205

213

213

213

212

213

212

213

212

213

212

1000

1050

1150

1200

1400

1500

1550

1600

$$\Delta T = T_{max} - T_{min}$$

1650

1750

305

313a

312a

312c

313a

312a

312c

313a

312a

312c

313b

312b 312d
312e

313b

312b 312d
312e

313b

312b 312d
312e

IR PHOTODETECTOR WITH INTERCALATED GRAPHENE LAYER AND RELATED METHODS

RELATED APPLICATION

This application is based upon prior filed Application No. 63/366,278 filed Jun. 13, 2022, the entire subject matter of which is incorporated herein by reference in its entirety.

TECHNICAL FIELD

The present disclosure relates to the field of sensor devices, and, more particularly, to infrared sensor devices and related methods.

BACKGROUND

Infrared (IR) sources/sensors are useful in many applications. For example, IR sources/sensors can be used in spectroscopy applications, and used to irradiate an unknown object. In some applications, IR sources/sensors are used for communications in electro-optic platforms. In some recent advances, near-IR (NIR) spectroscopy has been used to detect viral matter.

In some approaches, graphene has been used in IR applications. Graphene, one of the widely studied two-dimensional materials, comprises a single layer of carbon atoms in a honeycomb lattice. It has special electrical, optical, and mechanical properties due to its tunable band dispersion relation and atomic thickness. Because of its unique band structure, graphene possesses very high mobility and fast carrier relaxation time, making it an attractive candidate for ultrafast electronics and optoelectronic devices, such as transistors, optical switches, mid-infrared (MIR) photodetectors, photovoltaic devices, saturated absorbers, and ultrafast lasers, etc.

For example, U.S. Pat. Nos. 10,784,387 and 10,312,389, assigned to the present application's assignee, each discloses an optical detector device including a substrate, and a reflector layer carried by the substrate. The optical detector device comprises a first dielectric layer over the reflector layer, and a graphene layer over the first dielectric layer and having a perforated pattern therein.

SUMMARY

Generally, an IR photodetector device is to detect IR radiation in a frequency range (e.g., one or more of near-IR radiation and short-wave IR radiation (SWIR)). The IR photodetector device comprises an electrically conductive layer, first and second vertical supports extending from the electrically conductive layer and defining a cavity therebetween and over the electrically conductive layer, and a transparent electrically conductive layer carried by the first and second vertical supports and over the cavity. The transparent electrically conductive layer defines a gate electrode. The IR photodetector device comprises a detector layer over the transparent electrically conductive layer and having a perforated pattern. The detector layer comprises a plurality of graphene layers intercalated with a plurality of ferric chloride layers. The IR photodetector device also comprises first and second electrically conductive contacts carried by the transparent electrically conductive layer on opposite sides of the detector layer, and circuitry coupled to the first and second electrically conductive contacts and the transparent electrically conductive layer. The circuitry is configured to receive a sensing signal for the detected IR radiation from first and second electrically conductive contacts, and generate a configuration signal for the gate electrode to control the frequency range of the detected IR radiation.

In some embodiments, the perforated pattern may comprise an array of elliptical holes. The perforated pattern may extend across only a portion of the detector layer, for example, over 45%-55% of the detector layer.

The electrically conductive layer may comprise at least one of gold, silver, and platinum, for example. The first and second electrically conductive contacts may respectively define a source electrode and a drain electrode. The detector layer may comprise five graphene layers intercalated with two ferric chloride layers. For example, the detected IR radiation may have a wavelength between 1.3 μm and 3 μm.

Another aspect is directed to an IR photodetector detecting IR radiation in a frequency range. The IR photodetector includes an electrically conductive layer, first and second vertical supports extending from the electrically conductive layer and defining a cavity therebetween and over the electrically conductive layer, and a transparent electrically conductive layer carried by the first and second vertical supports and over the cavity. The transparent electrically conductive layer defines a gate electrode. The IR photodetector also includes a detector layer over the transparent electrically conductive layer and having a perforated pattern. The detector layer comprises a plurality of graphene layers intercalated with a plurality of ferric chloride layers. The IR photodetector also comprises first and second electrically conductive contacts carried by the transparent electrically conductive layer on opposite sides of the detector layer.

Yet another aspect is directed to a method for making an IR photodetector to detect IR radiation in a frequency range. The method comprises forming first and second vertical supports extending from an electrically conductive layer and defining a cavity therebetween and over the electrically conductive layer, and forming a transparent electrically conductive layer carried by the first and second vertical supports and over the cavity. The transparent electrically conductive layer defines a gate electrode. The method also includes forming a detector layer over the transparent electrically conductive layer and having a perforated pattern. The detector layer comprises a plurality of graphene layers intercalated with a plurality of ferric chloride layers. The method further comprises forming first and second electrically conductive contacts carried by the transparent electrically conductive layer on opposite sides of the detector layer.

DETAILED DESCRIPTION

Figure 1A:
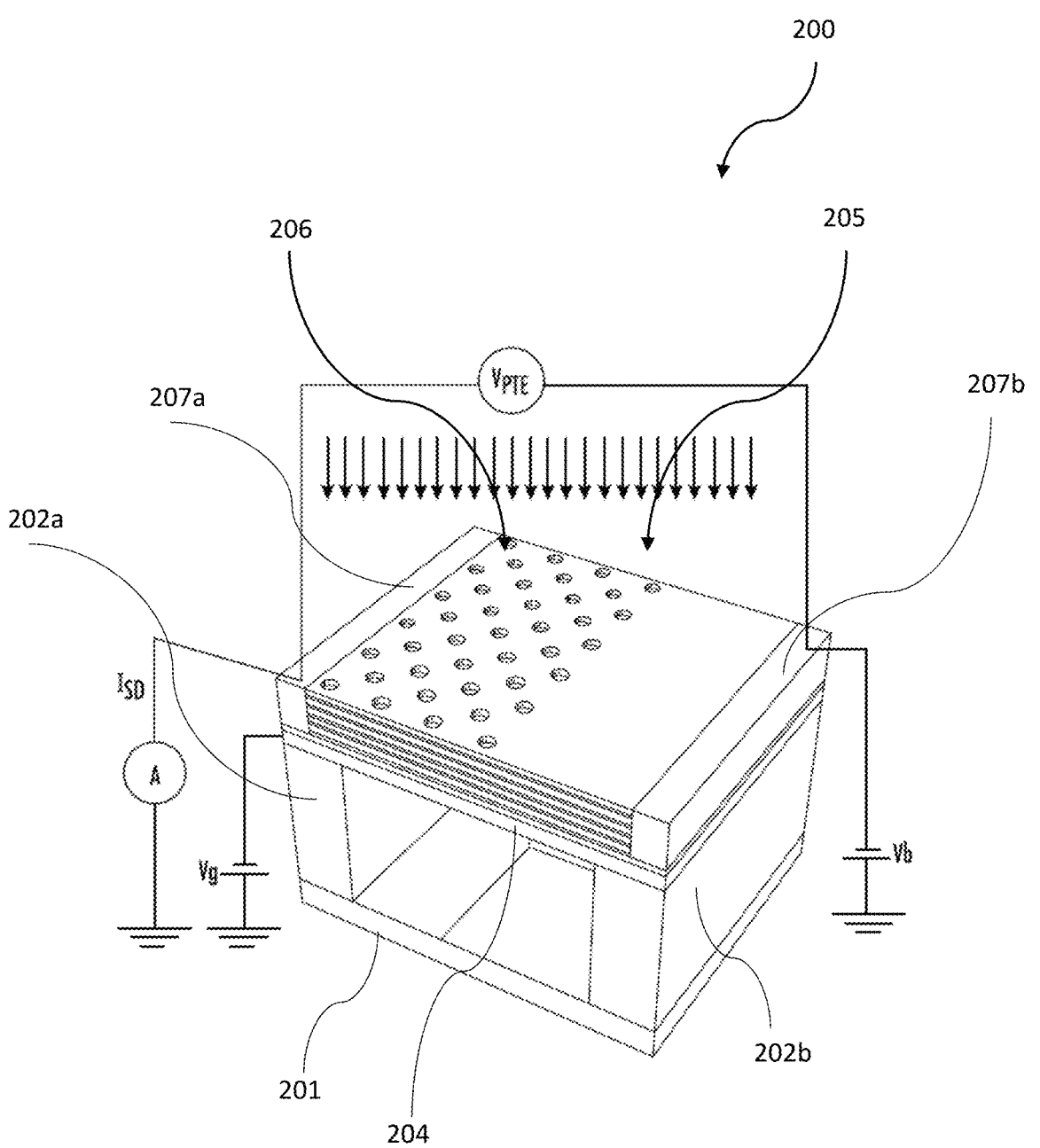
FIG. 1A is a schematic perspective view of an example embodiment of an IR photodetector device, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

Because of the weak absorbance of pristine graphene of around 2%, the present disclosure includes a nanopatterned chemical vapor deposition (CVD)-grown single-layer graphene (NPG) that exhibits absorbance exceeding 60% in the long-wavelength infrared (LWIR) regime (i.e., $\lambda=8$ μm to 12 μm). Recently, it has been shown that NPGs with smaller sizes of hexagonally arranged holes and smaller lattice constants exhibit absorbance of 80% in the mid-wavelength (MWIR) regime (i.e., $\lambda=3$ μm and 8 μm). Due to the resolution limit of e-beam lithographic systems, it is currently impossible to create smaller nanopatterns for increasing the absorbance of graphene using nanopatterning at shorter wavelengths.

Here, Localized surface plasmon (LSP) resonances can be realized in the technologically relevant NIR and SWIR regimes between $\lambda=1.3$ μm and 3 μm by means of nanopatterned multilayer graphene (NPMLG) intercalated with $FeCl_3$. Multilayer graphene intercalated with ferric chloride $FeCl_3$ (known as graphexeter) was created for realizing an all-graphene photodetector which operates at around a wavelength of 6 μm. The intriguing proximity effect of single layers of $FeCl_3$ between the graphene sheets is to p-dope the graphene sheets to a Fermi energy of $E_F=-0.6$ eV due to the large work function of $FeCl_3$ of $WFeCl_3=5.1$ eV and the resulting charge transfer between $FeCl_3$ and graphene, which has a work function of around $W_g=4.6$ eV. Remarkably, the band structures of graphene and $FeCl_3$ remain completely decoupled due to the incommensurate lattice structures (i.e., their lattice constants are 2.46 Å and 6.06 Å, respectively).

According to the article (D. Zhan, L. Sun, Z. H. Ni, L. Liu, X. F. Fan, Y. Wang, T. Yu, Y. M. Lam, W. Huang, and Z. X. Shen, Advanced Functional Materials 20, 3504 (2010)), $MLG-FeCl_3$ has a gap of 1.2 eV, to which the Fermi energy can be tuned by n-doping, corresponding to a wavelength of 1.03 μm, and is therefore transparent in the NIR and SWIR regimes between $\lambda=1.3$ μm and 3 μm. The refractive index of $FeCl_3$ is n=1.365, which gives a dielectric constant of $\varepsilon=n^2=1.86$. By creating a hexagonal nanopattern of holes inside the multilayer graphene/$FeCl_3$-intercalated heterostructure (NPMLG-$FeCl_3$), it is possible to achieve LSP resonances in the NIR and SWIR regimes between $\lambda=1.3$ μm to 3 μm with absorbance of nearly 100%. The method to tune the spectrally selective absorbance in NPMLG by means of a gate voltage $V_g$ is based on the fact that $V_y$ varies the Fermi energy $E_F$ inside NPMLG, thereby varying the charge density and therefore resonance wavelength of the LSPs around the circular holes in the wavelength regime between 1.3 μm and 3 μm.

Figure 1B:
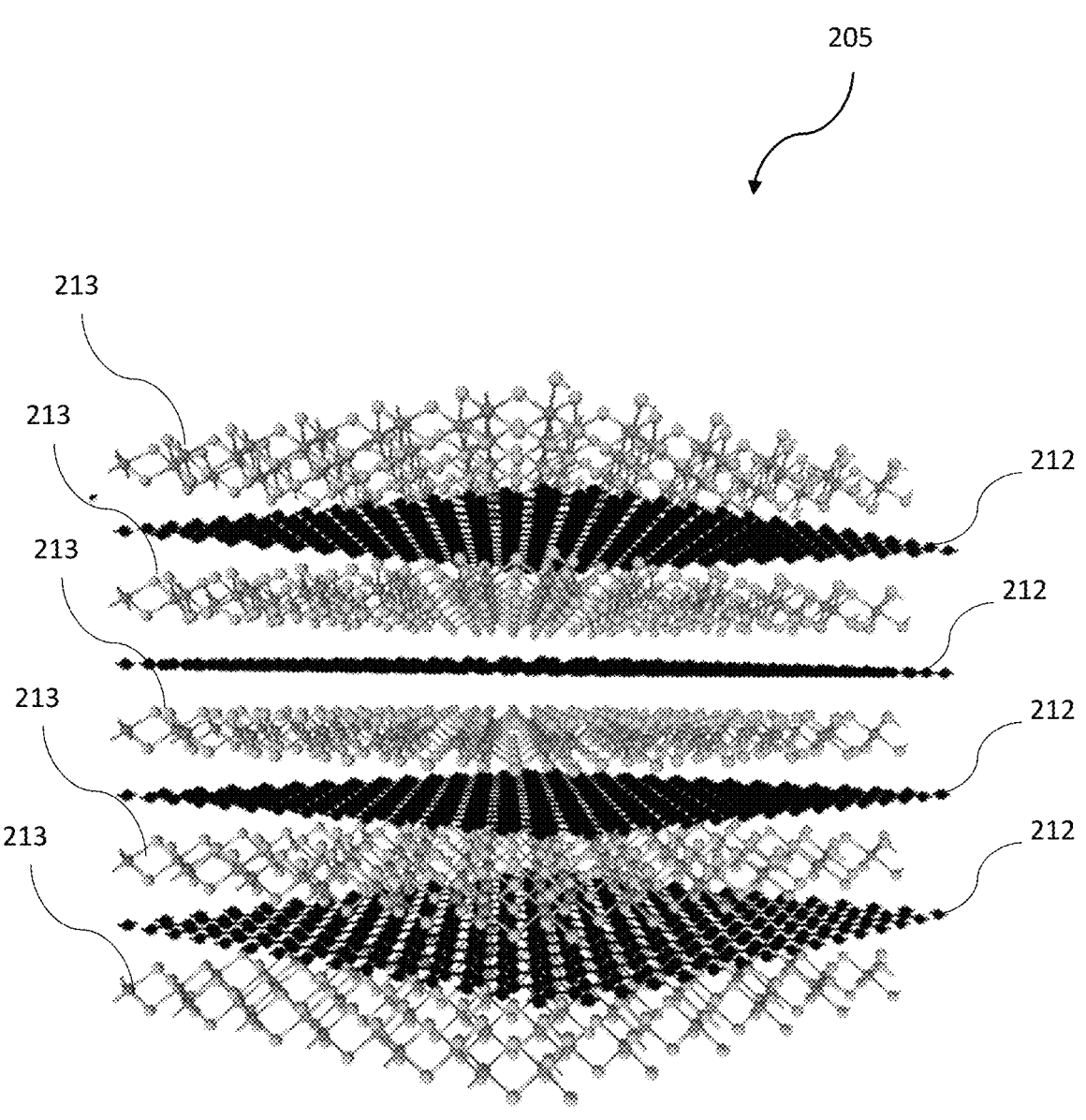
FIG. 1B is a schematic perspective view of a first example embodiment of the detector layer in the IR photodetector device of FIG. 1A.
Figure 2A:
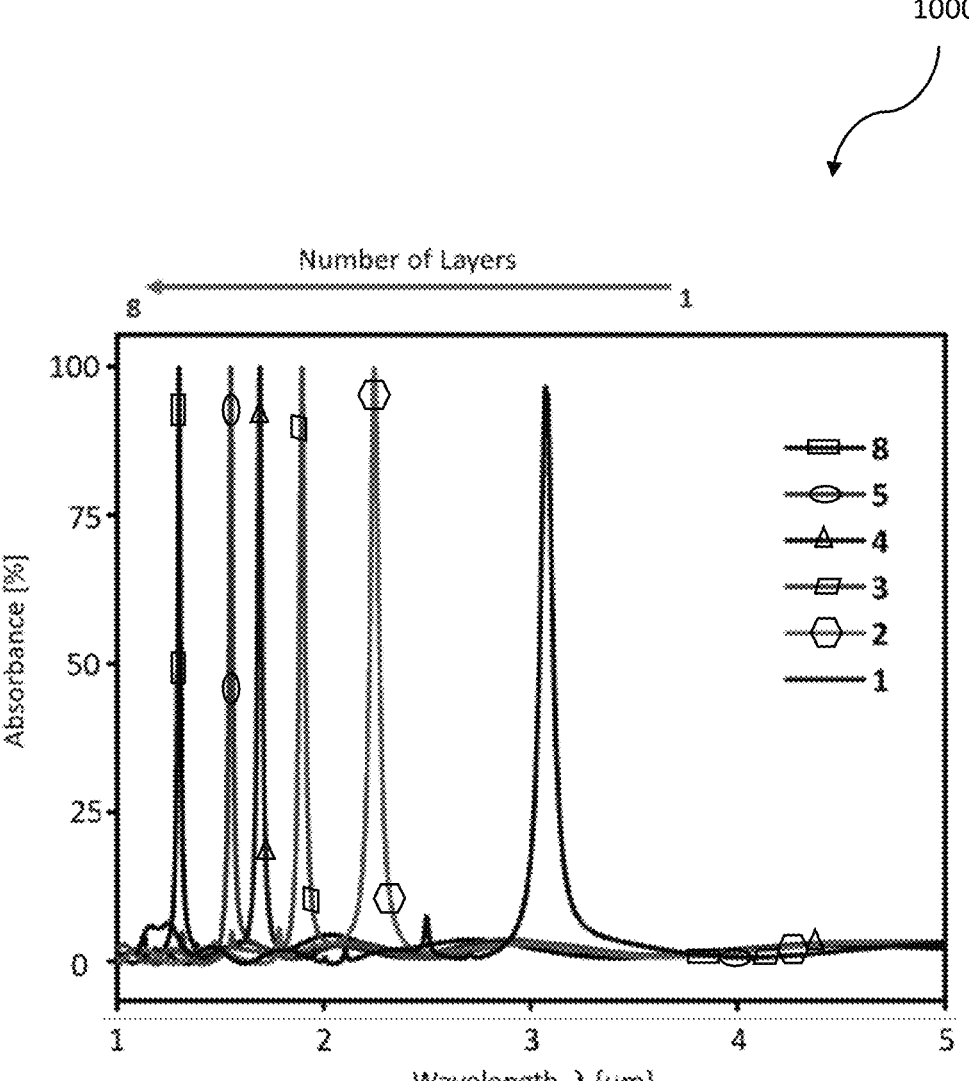
FIGS. 2A-2C are diagrams of absorbance in an example embodiment of the IR photodetector device of FIG. 1A.
Figure 2B:
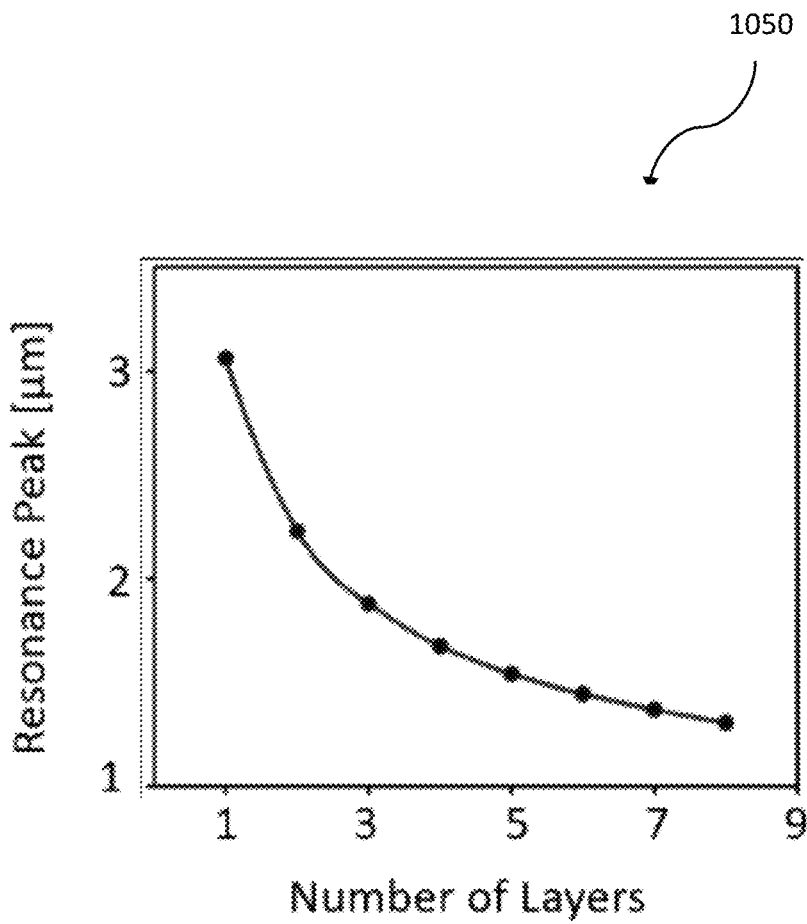
Figure 2C:
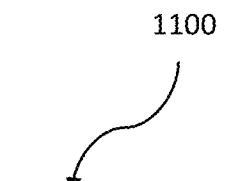
Figure 2C:
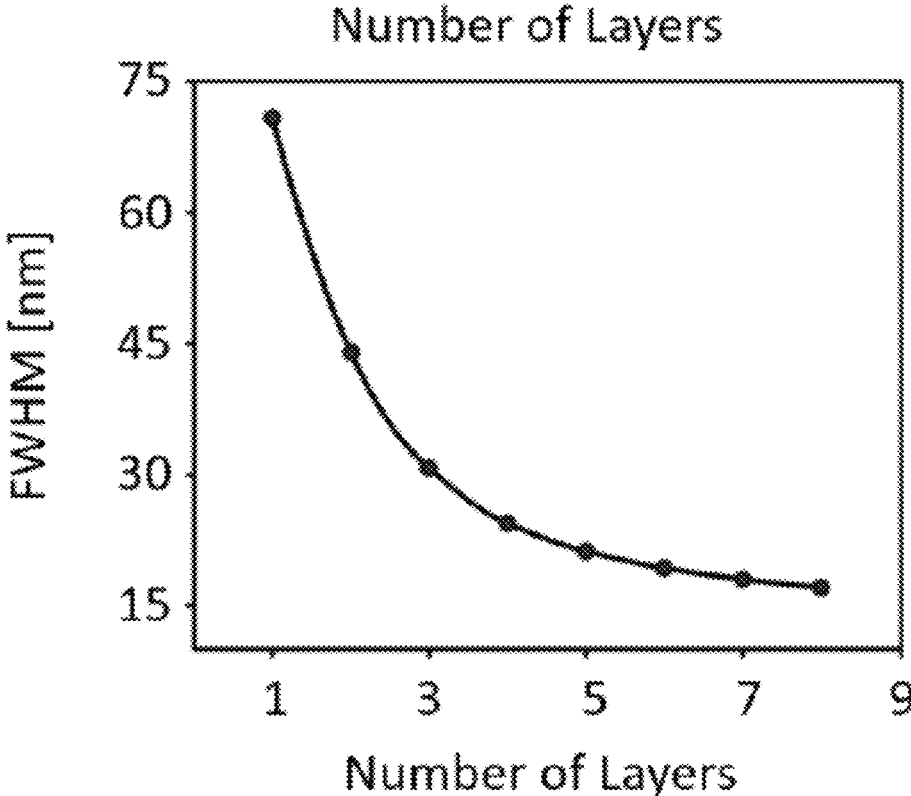
Figure 3A:
FIGS. 3A-3B are diagrams of band structure in bulk $FeCl_3$ and $MLG\text{-}FeCl_3$, respectively, in the example embodiment of the IR photodetector device of FIG. 1A.
Figure 3A:
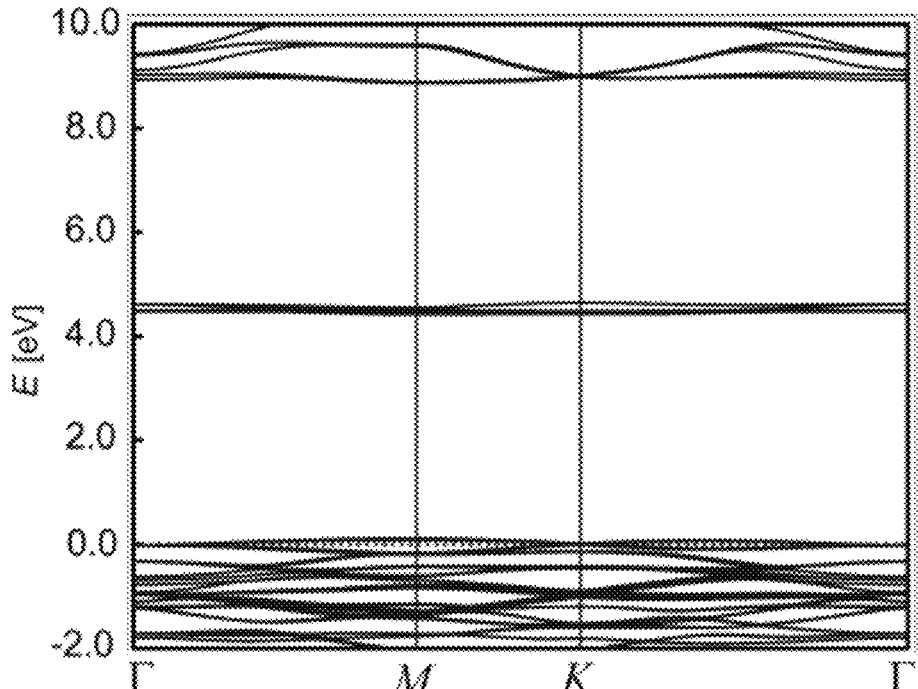
Figure 3B:
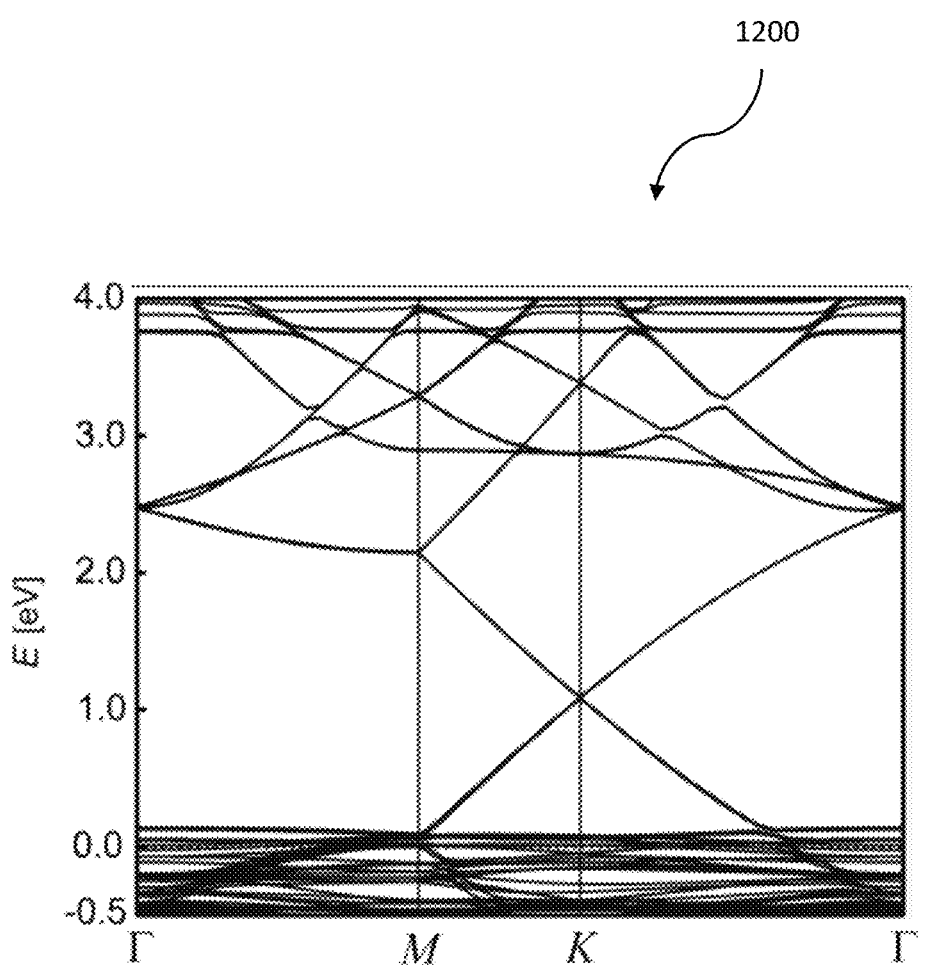

Taking advantage of the special properties of $FeCl_3$, a NIR photodetector based on NPMLG intercalated with $FeCl_3$ is disclosed. FIGS. 1A & 1B show the schematic of the disclosed NPMLG-$FeCl_3$ photodetector 200. When the incident NIR or SWIR light field is maximized at the position of the NPMLG-$FeCl_3$ heterostructure by means of the Au mirror and also in resonance with the LSPs around the holes of the NPMLG, the NIR or SWIR light gets strongly absorbed with absorbance exceeding 95%, as shown in FIG. 2A. FIGS. 2A-2C show absorbance $A(\lambda)$ of the NPMLG-$FeCl_3$ heterostructure shown in FIGS. 1A-1B with Fermi energy $E_F=-1.0$ eV, mobility $\mu=1500$ V/cm²s, hole diameter of a=40 nm, and period P=60 nm at T=300 K.

The results are obtained by finite-difference time domain (FDTD) calculations. In FIG. 2A (diagram 1000), for a single NPG sheet, the LSP resonance is at around 4.5 μm. At N=5, the LSP resonance is at 1.55 μm. At N=8, the LSP resonance is at 1.30 μm. In FIG. 2B (diagram 1050), the LSP resonance gets shorter and shorter with larger number N of NPG layers. In FIG. 2C (diagram 1100), the full width at half maximum (FWHM) of the LSP resonance gets smaller and smaller for larger N. Subsequently, the LSPs decay by creating hot carriers inside the graphene sheets due to boundary-assisted intraband Landau damping. While it is possible to detect the NIR or SWIR light by means of the bolometric effect relying on the change in conductance through NPG, this method is relatively slow because the lattice of NPG needs to be heated by means of the electron-phonon interaction before a signal can be detected, which is typically of the order of 1 ms. In order to reduce the response time to about 100 ns, the present embodiments include the nanopattern only on about half of the area of each graphene sheet, as shown in FIG. 1A. Due to the asymmetric heating inside each partially nanopatterned graphene, a temperature gradient is created, which leads to the diffusion of the hot carriers from the nanopatterned side to the pristine side of the graphene sheet. This charge motion yields a Seebeck voltage across the Au source-drain contacts, giving rise to the plasmonically enhanced photothermoelectric effect inside each partially nanopatterned graphene sheet. Due to the record-high temperature difference $\Delta T=5K$, the disclosed NPMLG-$FeCl_3$ NIR and SWIR photodetectors exhibit extraordinarily large responsivity of $R=6.15\times10^3$ V/W and detectivity of $D^*=2.33\times10^9$ Jones.

As mentioned above, due to limited resolution of e-beam lithography, it may be difficult to realize LSP resonances in NPG in the NIR or SWIR. A natural way to increase the plasmon frequency is to increase the charge density of the material. In graphene, this can be achieved by stacking several graphene sheets on top of each other. While for small twist angles between $\theta=0$ up to about 15°, twisted bilayer, trilayer, and multilayer graphene exhibit interlayer coupling, resulting in, for example, electrostatically tunable band gaps in bilayer graphene at $\theta=0$ and exotic many-body correlations, such as superconductivity, in twisted bilayer graphene at magic angle $\theta=1.1$, twist angles around $\theta=30$ in twisted bilayer graphene suppress completely interlayer coupling due to the mismatch of the k-space locations of the Dirac cones of the two layers. At first, such incommensurate stackings of graphene layers might look like being ideal candidates for increasing the plasmon frequency of the LSPs. However, the electrostatic doping of all the incommensurate graphene layers is impossible due to screening and also due to electronic decoupling of the layers.

In the article (F. Withers, T. H. Bointon, M. F. Craciun, and S. Russo, ACS Nano 7, 5052 (2013)), the optoelectronic properties of graphene/FeCl$_3$— intercalated few layer graphene, which they called graphexeter, were disclosed. They demonstrated a photodetector based on the photothermoelectric effect with a responsivity of R=0.1 V/W at a wavelength of around =6 m. Some approaches include intercalation doped multilayer graphene heterostructures by the realization of modulation doping of multilayer graphene by means of α-RuCl$_3$. Due to the large work function of α-RuCl$_3$, W$_α$—RuCl$_3$=6.1 eV, substantial p-doping of all graphene layers of around E$_F$=−0.8 eV can be achieved without electrostatic gating. In some approaches, the band gap of RuCl$_3$ is revealed via IR reflectivity and transmission measurements to be 200 meV. However, photoemission and inverse photoemission spectroscopies find a much larger band gap of 1.9 eV.

Figure 4A:
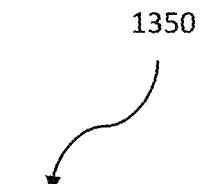
FIGS. 4A-4D are diagrams of absorbance in the example embodiment of the IR photodetector device of FIG. 1A.
Figure 4A:
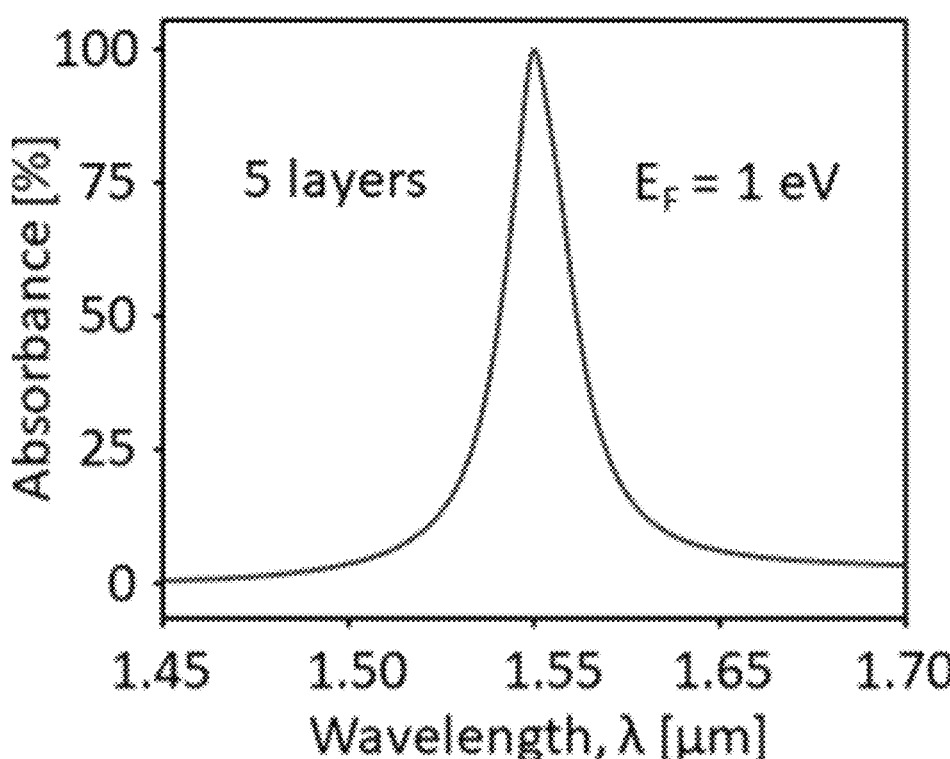
Figure 4B:
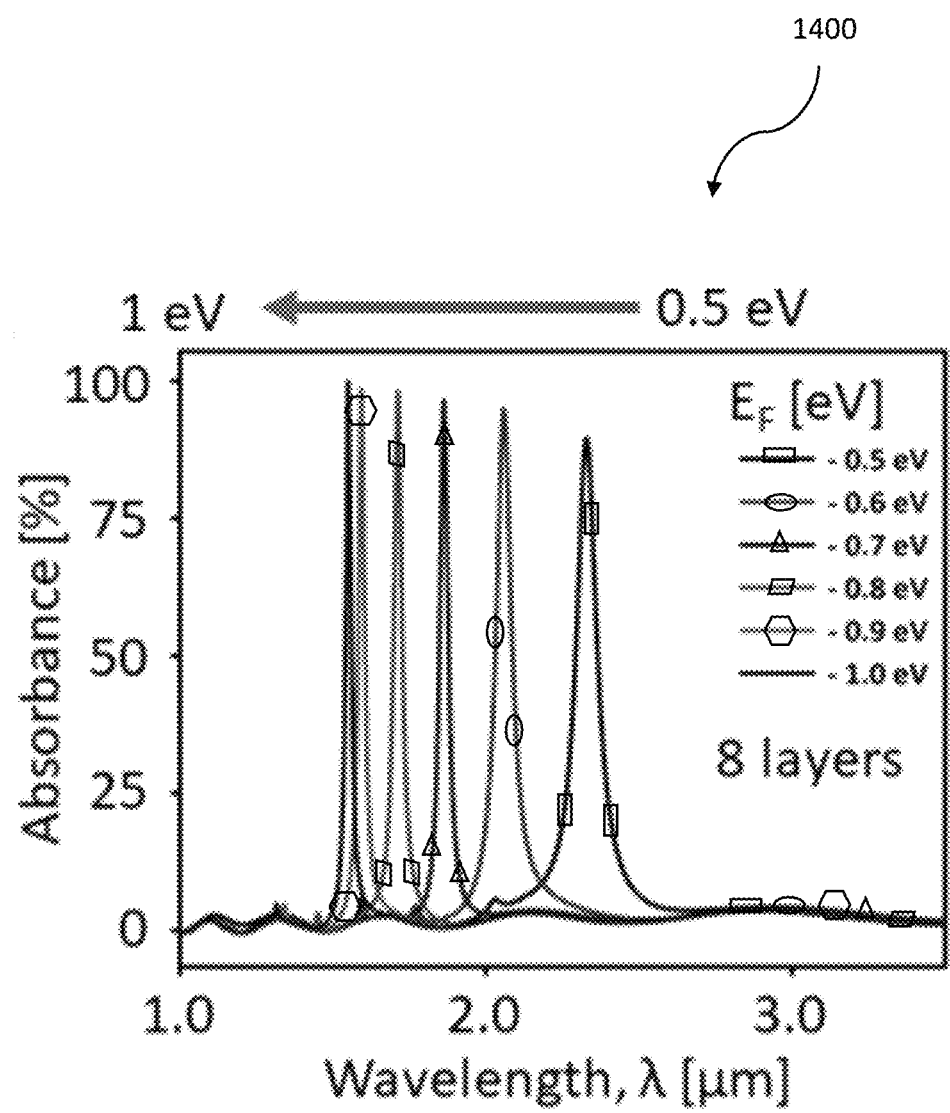
Figure 4C:
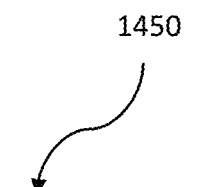
Figure 4C:
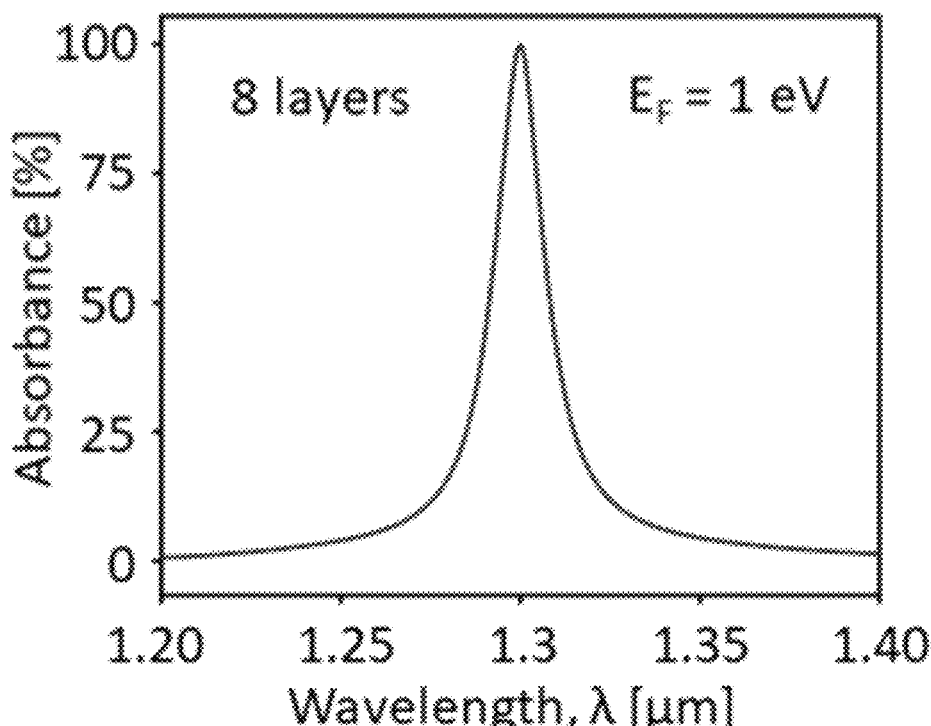
Figure 4D:
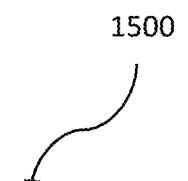
Figure 4D:
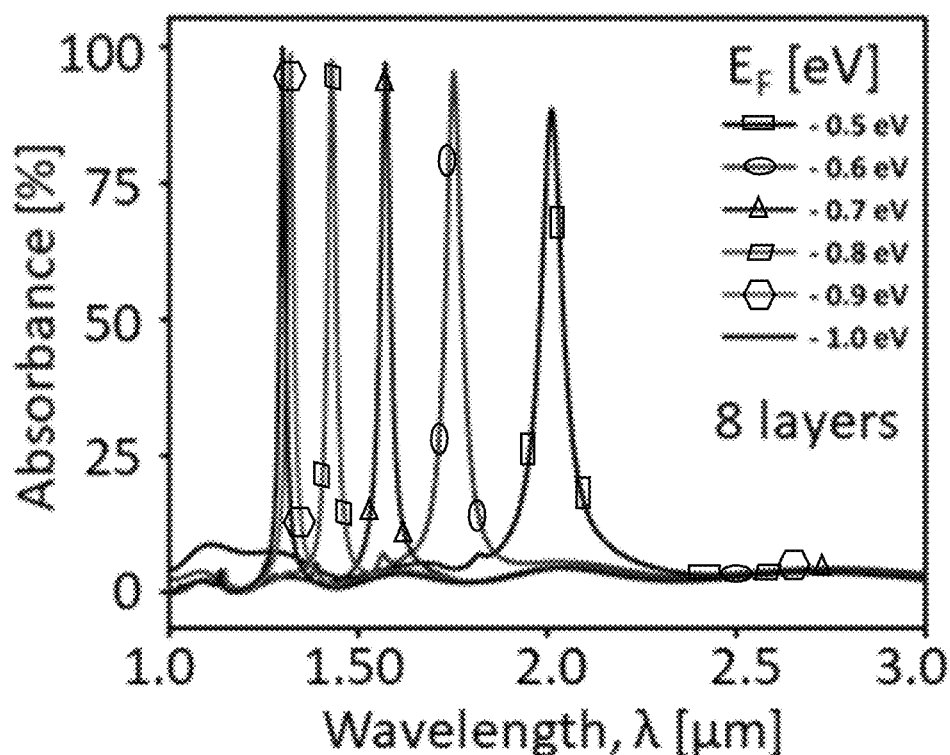

Since RuCl$_3$ has an optical band gap of the order of 200 meV (See S. Reschke, F. Mayr, Z. Wang, S.-H. Do, K.-Y. Choi, and A. Loidl, Phys. Rev. B 96, 165120 (2017)), it is transparent only up to a wavelength of λ=3 μm. In contrast, FeCl$_3$-intercalated few layer graphene MLG-FeCl$_3$ is transparent in the visible, infrared, and THz regimes due to the large band gap of FeCl$_3$. The absorbance of MLG-FeCl$_3$ is approximately N×2.6%, where N is the number of layers. This is the reason why MLG-FeCl$_3$ can be used as a transparent electrode in the visible, infrared, and THz regimes. Taking advantage of the LSP resonances in nanopatterned graphene, the absorbance of NPMLG-FeCl$_3$ in the NIR and SWIR regimes to nearly 100% can be increased, as shown in FIGS. 4A-4D. FIGS. 4A-4D show absorbance as a function of Fermi energy E$_F$. In FIG. 4A, for NPMLG-FeCl$_3$ containing 5 layers of graphene, the LSP resonance occurs at λ=1.55 μm. In FIG. 4B (diagram 1400), the LSP resonance of the 5-graphene layer structure can be tuned from λ=2.5 μm to 1.55 μm by varying the Fermi energy between E$_F$=−0.5 eV and −1.0 eV. In FIG. 4C, for NPMLG-FeCl$_3$ containing 8 layers of graphene, the LSP resonance occurs at λ=1.30 μm. In FIG. 4D (diagram 1500), the LSP resonance of the 8-graphene layer structure can be tuned from λ=2.0 μm to 1.30 μm by varying the Fermi energy between E$_F$=−0.5 eV and −1.0 eV.). Therefore, a heterostructure material NPMLG-FeCl$_3$ for creating a NIR and SWIR photodetectors based on the plasmonically enhanced photothermoelectric effect is disclosed, which is shown in FIG. 1A. The MLG channel length, which is the distance between the Au source and drain contacts, is chosen to be L=10 μm, of the same order as the diffusion length of charge carriers in graphene. The MLG channel width is chosen to be W=10 μm as well because carrier collection does not need to be enhanced. The optimized hexagonal nanopattern on about half of the MLG-FeCl$_3$ heterostructure (See FIG. 1A) has a period of 60 nm and a hole diameter of 40 nm.

For the subsequent FDTD calculations, first ab-initio density functional theory (DFT) calculations are performed to determine the band structure of MLG-FeCl$_3$. The generalized gradient approximation (GGA) plus Hubbard-U parameter is used with the Perdew-Burke-Ernzerhof (PBE) parametrization of the correlation energy.

As shown in FIG. 1B, MLG-FeCl$_3$ with stage 1 intercalation is considered, where single graphene layers are sandwiched by single FeCl$_3$ layers. Here, AB stacking between adjacent graphene layers, similar to pristine graphite, and ABC stacking between adjacent FeCl$_3$ layers, similar to pristine bulk FeCl$_3$ is considered. The translational shifts between graphene layers and also between FeCl$_3$ layers ensures complete decoupling of the electron states between the graphene-graphene, graphene-FeCl$_3$, and FeCl$_3$—FeCl$_3$ layers. Following the article (Y. Li and Q. Yue, Physica B: Condensed Matter 425, 72 (2013), the contents of which are hereby incorporated by reference in their entirety), the lattice mismatch may be reduced by using a supercell with 2×2 periods of FeCl$_3$ and 5×5 periods of graphene. The results of the DFT GGA+U band structure calculation are shown in FIGS. 3A-3D. A choice of U=6 eV results in a FeCl$_3$ band gap of around 4.5 eV (See FIG. 3A (diagram 1150)). The difference is that by incorporating a relative translational shift between each pair of adjacent layers, achieving complete decoupling between the electron states of each layer. This is visible for Bloch states localized in FeCl$_3$ in MLG-FeCl$_3$ and Bloch states localized in graphene in MLG-FeCl$_3$. The band structure of MLG-FeCl$_3$ shown in FIG. 3B (diagram 1200) shows clearly strong p-doping by shifting the Fermi energy to E$_F$=−1.0 eV relative to the graphene Dirac point.

In order to perform the FDTD, the linear dispersion relation of graphene is used, which gives rise to the intraband optical conductivity:

$$\sigma_{intra}(\omega) = \frac{e^2}{\pi\hbar^2} \frac{2k_BT}{\tau^{-1} - i\omega} \ln\left[2\cosh\left(\frac{\varepsilon_F}{2k_BT}\right)\right] \tag{1}$$

which in the case of $\varepsilon_F \gg k_BT$ is reduced to $$\sigma_{intra}(\omega) = \frac{e^2}{\pi\hbar^2} \frac{E_F}{\tau^{-1} - i\omega} = \frac{2\varepsilon_m \omega_p^2}{\pi\hbar^2(\tau^{-1} - i\omega)} \tag{2}$$

where τ is determined by impurity scattering and electron-phonon interaction $\tau^{-1} = \tau_{imp}^{-1} + \tau_{e-ph}^{-1}$. Using the mobility μ of the NPG sheet, it can be presented in the form $\tau^{-1} = ev_F^2/(\mu E_F)$, where $v_F = 10^6$ m/s is the Fermi velocity in graphene. $\omega_p = \sqrt{e^2 E_F/2\varepsilon_m}$ is the bulk graphene plasma frequency. Since the graphene sheets are electronically decoupled from each other by the insulating FeCl$_3$ layers, the optical conductivity of MLG-FeCl$_3$ is given by $$\sigma_{intra}^{MLG-FeCl_3}(\omega) = N\frac{e^2}{\pi\hbar^2} \frac{E_F}{\tau^{-1} - i\omega} \tag{3}$$

where N is the number of graphene layers. This formula is only valid for excitation energies below the band gap E$_q$=1 eV of FeCl$_3$. Since the LSP resonances occur at energies between 250 meV and 950 meV, the optical phonons in graphene at 200 meV and the optical phonons in FeCl$_3$ at 2.7 meV, 7 meV can be safely neglected.

Here, FDTD is used to calculate the absorbance as a function of Fermi energy E$_F$ for NPMLG-FeCl$_3$ containing N=5 and N=8 layers of graphene, as shown in FIGS. 4A & 4C (diagrams 1350, 1450). The LSP resonances for the 5-graphene layer and 8-graphene layer structures exhibit wide tunability as a function of the Fermi energy E$_F$. Compared to the prior approaches using an NPG, the absorbance remains above 80% even for lower Fermi energies of E$_F$=−0.5 eV. This large absorbance gives rise to strong heating of the nanopatterned side of the NPMLG structure.

Figure 5A:
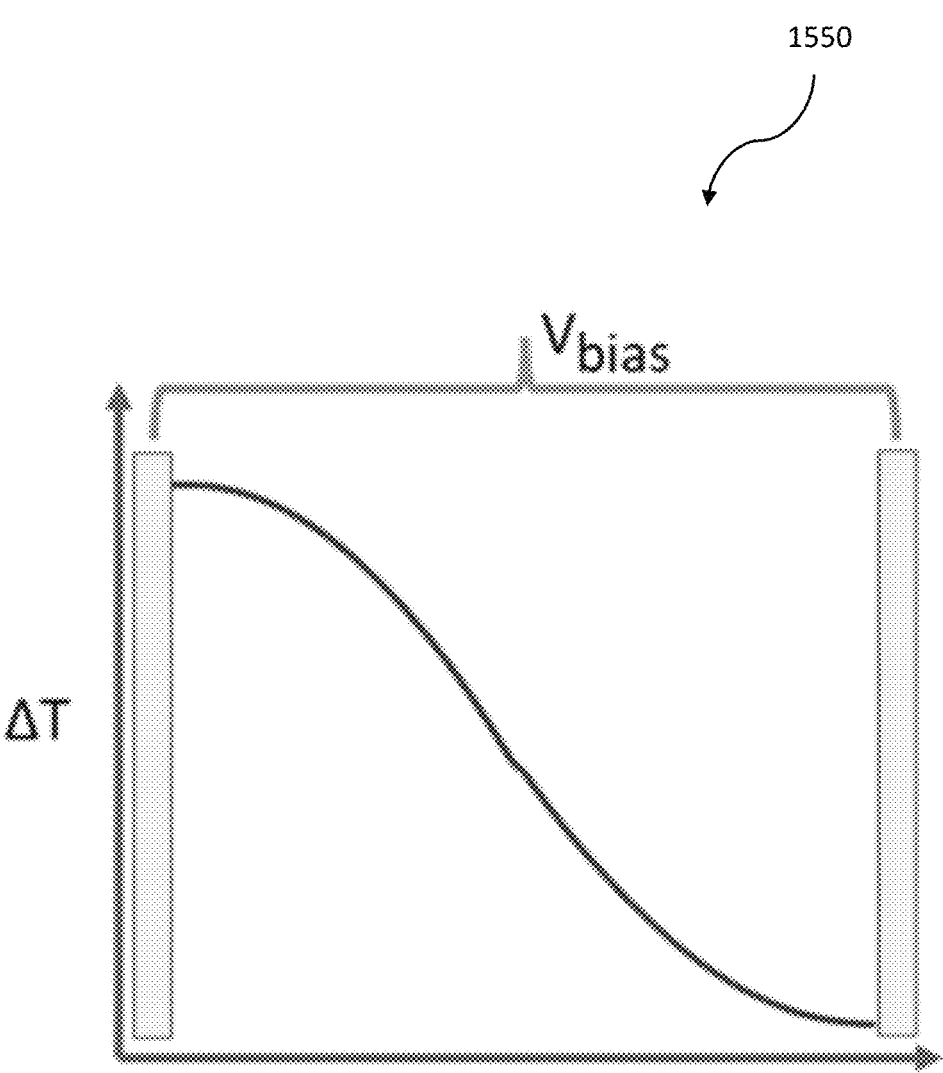
FIGS. 5A-5D are diagrams of temperature in the example embodiment of the IR photodetector device of FIG. 1A.
Figure 5B:
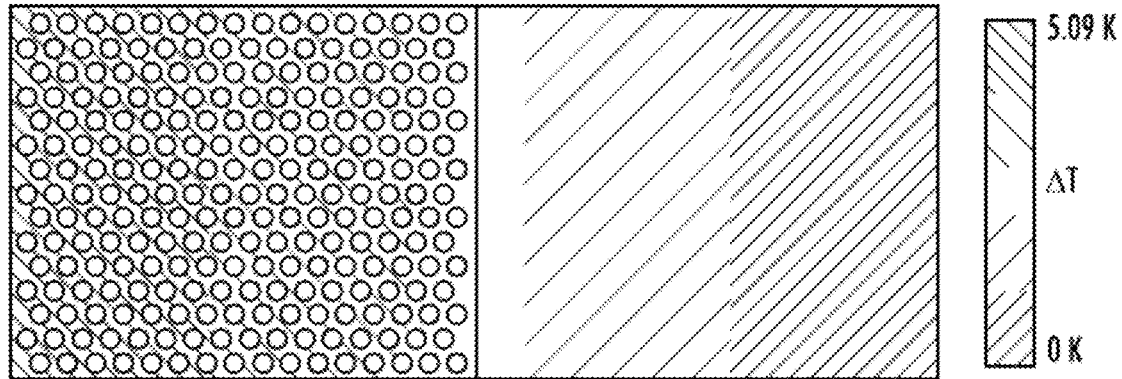
Figure 5B:
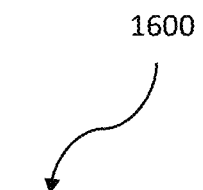
Figure 5C:
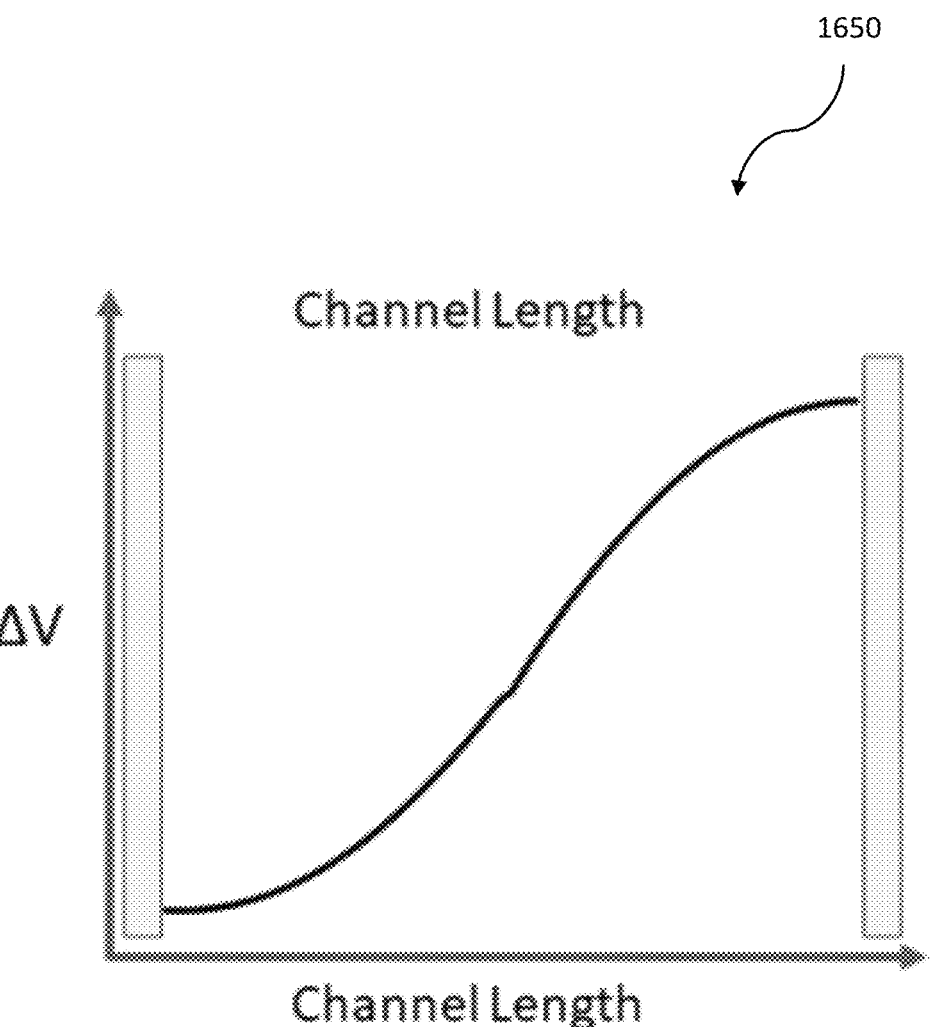
Figure 5D:
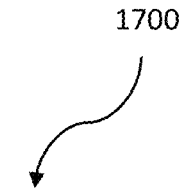
Figure 5D:
Figure 5D:
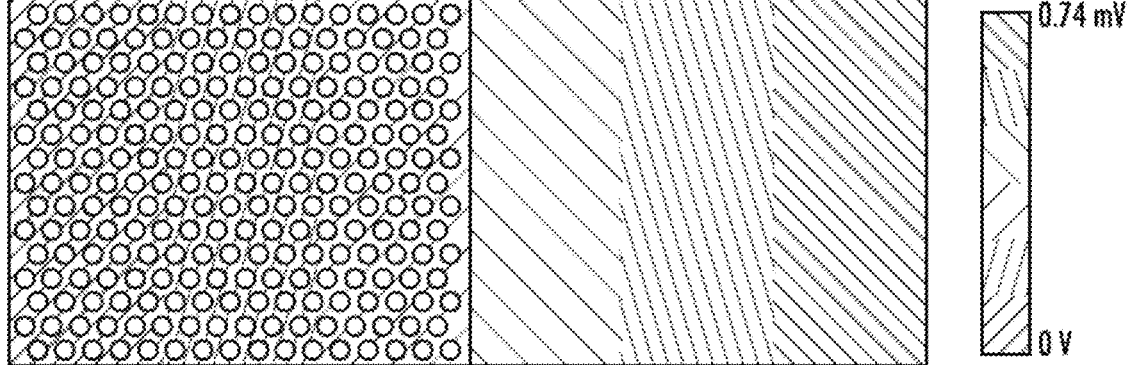

Using COMSOL, the temperature distribution inside the NPMLG-$FeCl_3$ heterostructure, as shown in FIGS. 5A-5D (diagrams 1550, 1600, 1650, 1700) is generated. FIGS. 5A-5D include COMSOL simulated temperature gradient and Seebeck voltage generated by the plasmonically enhanced photothermoelectric effect in NPMLG-$FeCl_3$ heterostructure containing N=5 graphene layers for the LSP resonance at $\lambda$=1.55 µm. The channel length and width are both 10 µm. For an IR light incident power of $P_{inc}$=120 nW, a temperature difference of $\Delta T$=5.09 K (a,b) and a Seebeck voltage of $\Delta V$=0.74 mV (c,d) are achieved. The photothermoelectric effect in the NPMLG-$FeCl_3$ heterostructure relies on large difference in absorbance between the patterned and the unpatterned side (i.e., the patterned side exhibits a plasmonically enhanced absorbance of nearly 100% while the unpatterned side absorbs only about 2% of the incident IR light). This results in a temperature gradient across the channel length $\Delta X = X_L - X_R$, where $X_L$ and $X_R$ are the edge positions of the left and right Au contacts, respectively. The hot carriers created on the patterned side due to Landau damping diffuse to the unpatterned side, resulting in a charge separation and Seebeck voltage:

$$V_S = \int_{X_L}^{X_R} S(x) \frac{\partial T_e(x)}{\partial x} dx \qquad (4)$$

where S(x) is the Seebeck coefficient, which has two values Spat and Sunpat on the patterned and unpatterned side, respectively. $T_e(x)$ is the temperature profile of the charge carriers across the channel length, as shown in FIG. 5B. The Seebeck coefficient is approximated well by Mott's formula:

$$S = \frac{\pi^2 k_B^2 T}{3e} \frac{\partial \ln}{\partial E_F} \qquad (5)$$

where, $k_B$, and e are the electrical conductivity, Boltzmann constant, and elementary charge, respectively, and S depend on the $E_F$.

Starting from room temperature at T=300 K and an incident power of the IR light of $P_{inc}$=120 nW, a temperature difference of T=5.09 K and a Seebeck voltage of $V_S$=0.74 mV is obtained. The Fermi energy of the graphene layers is kept at $E_F$=−1.0 eV, close to the intrinsic p-doping level due to the intercalation with $FeCl_3$. A bias voltage of $V_b$=±0.6 V is applied for measuring the photocurrents in both directions. Owing to the bias voltage, both plasmonically enhanced photothermoelectric and bolometric effects contribute. In order to remove the bolometric effect for the measurements, the dark and light Seebeck voltages $V_{S,d}$ and $V_{S,l}$ are calculated in the absence and presence of the incident IR light, respectively. The Seebeck voltage is then calculated by $V_S = V_{S,d} - V_{S,l}$. For a constant Fermi energy $E_F$, a DC bias voltages $+V_b$ and $-V_b$ are applied for two separate simulations across the channel width, which yields the currents $I_> = I + I_S$ and $I_< = -I + I_S$, respectively. I is the current driven by the bias voltage and $I_S = (I_> + I_<)/2$ is the Seebeck current, which is captured in the absence ($I_{S,d}$) and presence ($I_{S,l}$) of the incident IR light. Since the holes are circularly symmetric, $I_{S,d}$ is independent of the polarization of the IR light. The Seebeck current and voltage are then calculated by $I_S = I_{S,l} - I_{S,d}$ and $V_S = RI_S$, respectively, where R is the resistance of the NPMLG-$FeCl_3$ heterostructure. For the incident IR light, a Gaussian beam with spot size radius of $R_{spot}$=2 mm is assumed, a focus size radius of:

$$R_f = \sqrt{(x - x_f)^2 + (y - y_f)^2},$$

and an incident power of $P_{inc}$=120 nW. The heat flux through the edges of the holes in the nanopattern is then:

$$q_0 = \frac{2P_{inc}}{\pi R_{spot}^2} e^{-2R_f^2/R_{spot}^2} \qquad (6)$$

For an absorbance A obtained from FDTD, the absorbed heat flux is determined by $q_A = Aq_0$. The responsivity is obtained by:

$$\mathcal{R} = \frac{V_S}{P_{inc}} \qquad (7)$$

Figure 6:
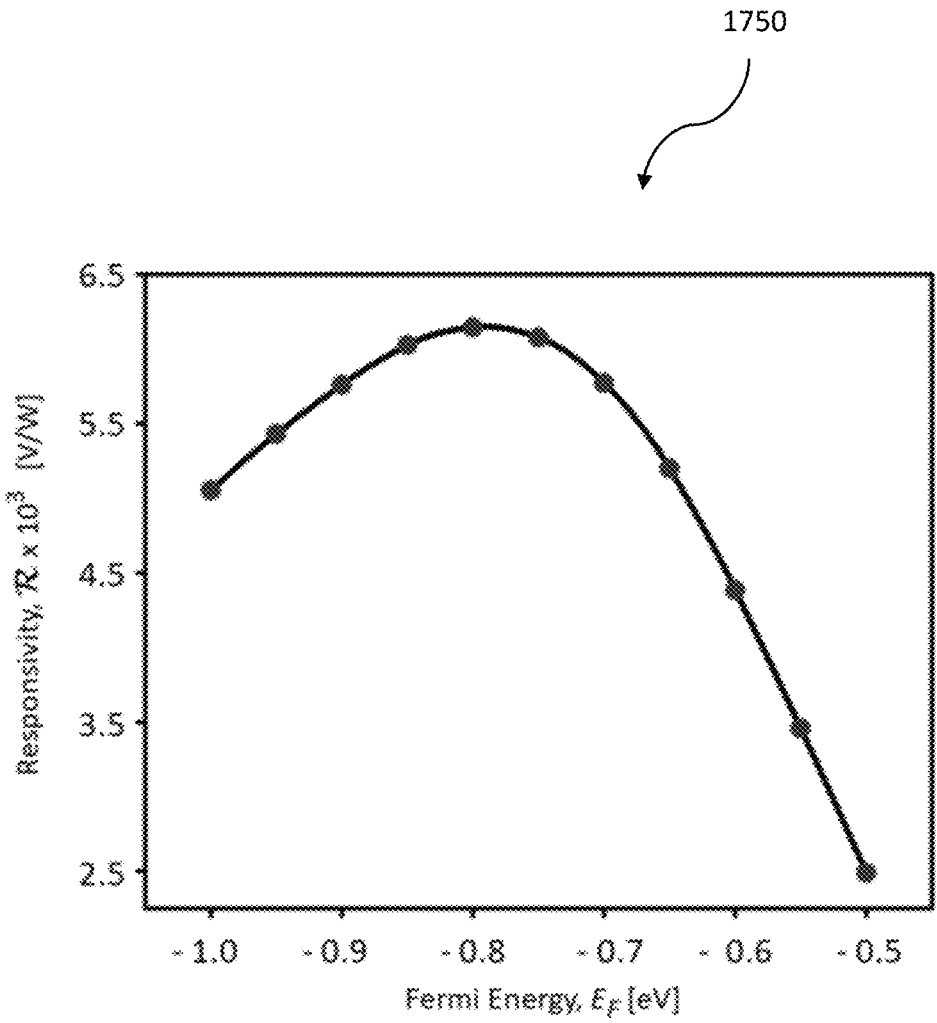
FIG. 6 is a diagram of responsivity in the example embodiment of the IR photodetector device of FIG. 1A.

The responsivity as a function of Fermi energy $E_F$ is shown in FIG. 6. (diagram 1750) (FIG. 6: A maximum responsivity of R=6.15×10³ V/W is achieved at a Fermi energy of $E_F$=−0.8 eV for an incident power of $P_{inc}$=120 nW and a bias voltage of $V_b$=0.6 V). R ranges from a minimum of about 2.49×10³ V/W for $E_F$=−0.5 eV to a maximum of about 6.15×10³ V/W for $E_F$=−0.8 eV. Assuming a typical noise equivalent power of NEP=7 pW/$Hz^{1/2}$ for CVD graphene, a maximum detectivity is obtained as:

$$D^* = \sqrt{LW}/NEP = 0.74 \times 10^9$$

Jones. If the channel is scaled to a width to W=200 µm, it is possible to achieve D*=2.33×10⁹ Jones.

In conclusion, a NPMLG-$FeCl_3$ can be used to develop a plasmonically enhanced NIR and SWIR photodetector with spectrally tunable selective light absorption. Most importantly, the LSPs along with an optical cavity increase the absorbance from about N×2.6% for multilayer graphene-$FeCl_3$ (without patterning) to nearly 100% (i.e., greater than 98%) for NPMLG-$FeCl_3$, where the strong absorbance occurs locally inside the graphene sheets only, thereby outperforming state-of-the-art graphene-based photodetectors. Remarkably, by taking advantage of NPMLG-$FeCl_3$ with a number of graphene layers 15N-8, it is possible to develop photodetectors that operate over a wide wavelength range from A=1.3 µm down to $\lambda$=12 µm and beyond, covering the NIR, SWIR, MWIR, and LWIR regimes. In some example applications, the IR photodetector device 200 can be used to develop an IR spectroscopy and detection platform based on NPMLG that will be able to detect a variety of molecules that have IR vibrational resonances, such as CO, $CO_2$, NO, $NO_2$, $CH_4$, TNT, $H_2O_2$, acetone, TATP, Sarin, VX, viruses, etc.

Figure 7:
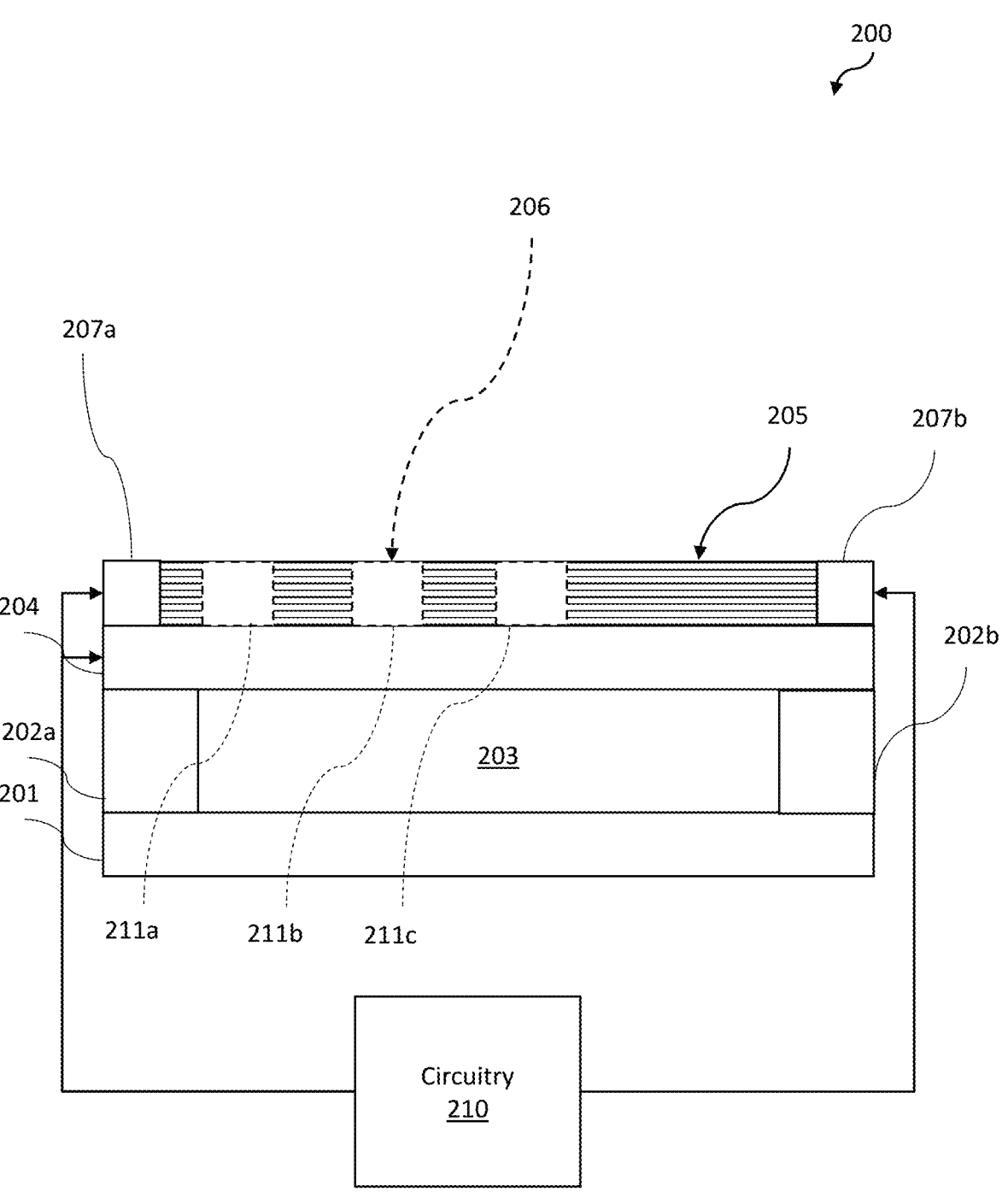
FIG. 7 is a schematic side view of the IR photodetector device of FIG. 1A.

Referring now to FIGS. 1A & 7, an IR photodetector device 200 according to the present disclosure is now described. It should be appreciated that any of the features discussed above for embodiments of the NPMLG-$FeCl_3$ can be combined with the IR photodetector device 200 and vice versa.

The IR photodetector device 200 detects IR radiation in a frequency range. The detected IR radiation may comprise at least one of NIR radiation and SWIR radiation, and the detected IR radiation may have a wavelength between 1.3 μm and 3 μm, for example. In other applications, the operational wavelength of the IR photodetector device 200 may be changed.

The IR photodetector device 200 comprises an electrically conductive layer 201. The electrically conductive layer 201 illustratively comprises a planar shaped layer. For example, the electrically conductive layer 201 may comprise at least one of gold, silver, and platinum.

The IR photodetector device 200 comprises first and second vertical supports 202a-202b extending from the electrically conductive layer 201 and defining a cavity 203 therebetween and over the electrically conductive layer. The first and second vertical supports 202a-202b may comprise a semiconductor, for example, silicon.

The IR photodetector device 200 comprises a transparent electrically conductive layer 204 over and carried by the first and second vertical supports 202a-202b. The transparent electrically conductive layer 204 is also over the cavity 203. The transparent electrically conductive layer 204 may comprise indium tin oxide, for example.

The IR photodetector device 200 illustratively includes a detector layer 205 over the transparent electrically conductive layer 204 and having a perforated pattern 206. The detector layer 205 comprises a plurality of graphene layers intercalated with a plurality of ferric chloride ($FeCl_3$) layers. The perforated pattern 206 illustratively includes an array of elliptical holes 211a-211c. The perforated pattern 206 illustratively extend across only a portion of the detector layer 205. The perforated pattern 206 illustratively extends over 45%-55% of the detector layer 205. As discussed in detail above, the partial perforated pattern 206 may improve response time of the IR photodetector device 200.

The IR photodetector device 200 comprises first and second electrically conductive contacts 207a-207b carried by the transparent electrically conductive layer 204 on opposite sides of the detector layer 205. For example, the first and second electrically conductive contacts 207a-207b may comprise at least one of gold, silver, and platinum.

The IR photodetector device 200 illustratively comprises circuitry 210 coupled to the first and second electrically conductive contacts 207a-207b and the transparent electrically conductive layer 204. The circuitry 210 is configured to receive a sensing signal for the detected IR radiation from first and second electrically conductive contacts 207a-207b, and generate a configuration signal for the gate electrode to control the frequency range of the detected IR radiation (i.e., spectrally tuning the detected radiation).

In particular, during operation of the IR photodetector device 200, the circuitry 210 is configured to drive the transparent electrically conductive layer 204 as a gate electrode, and the first and second electrically conductive contacts 207a-207b respectively as a source electrode and a drain electrode. The method to tune the spectrally selective absorbance in IR photodetector device 200 by means of a gate voltage $V_g$ is based on the fact that $V_g$ varies the Fermi energy $E_F$ inside IR photodetector device, thereby varying the charge density and therefore resonance wavelength of the LSPs around the circular holes in the wavelength regime between 1.3 μm and 3 μm.

Figure 8:
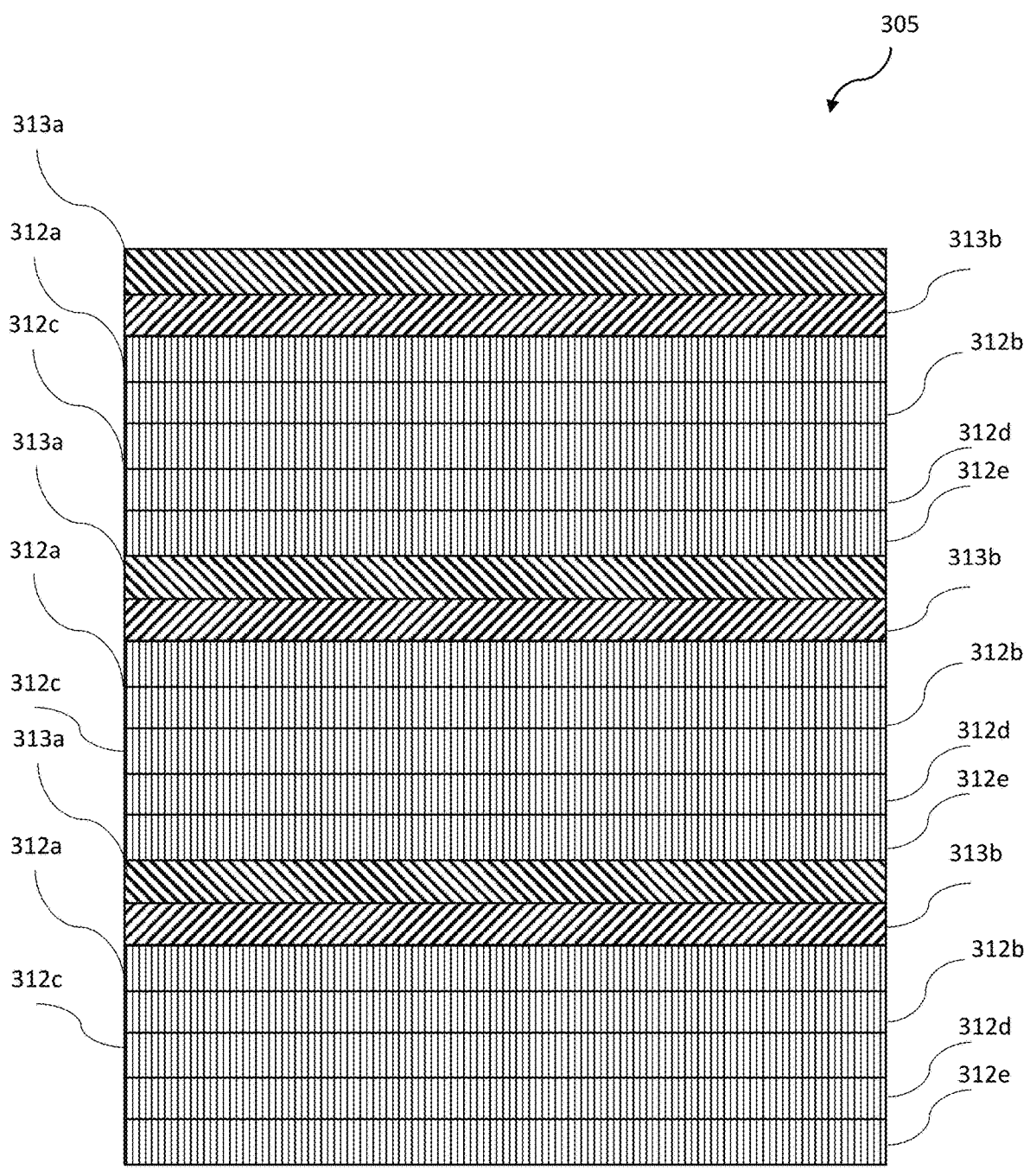
FIG. 8 is a schematic side view of a second example embodiment of the detector layer from the IR photodetector device of FIG. 1A.

Referring now to FIG. 8, an example embodiment of the detector layer 305 is described. Here, to reduce lattice mismatch, the detector layer 305 illustratively comprises five graphene layers 312a-312e intercalated with two ferric chloride layers 313a-313b. In another exemplary embodiment shown in FIG. 1B, the detector layer 205 illustratively comprises one graphene layer 212 intercalated with one ferric chloride layers 213.

Yet another aspect is directed to a method for making an IR photodetector 200 to detect IR radiation in a frequency range. The method comprises forming first and second vertical supports 202a-202b extending from an electrically conductive layer 201 and defining a cavity 203 therebetween and over the electrically conductive layer, and forming a transparent electrically conductive layer 204 carried by the first and second vertical supports and over the cavity. The transparent electrically conductive layer 204 defines a gate electrode. The method also includes forming a detector layer 205 over the transparent electrically conductive layer 204 and having a perforated pattern 206. The detector layer 205 comprises a plurality of graphene layers intercalated with a plurality of ferric chloride layers. The method further comprises forming first and second electrically conductive contacts 207a-207b carried by the transparent electrically conductive layer 204 on opposite sides of the detector layer 205.

Other features relating to IR applications are disclosed in co-pending application: titled "IR SOURCE AND PHASED ANTENNA WITH GRAPHENE LAYER AND RELATED METHODS," application Ser. No. 17/444,087, which is incorporated herein by reference in its entirety.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

The invention claimed is:

1. An infrared (IR) photodetector device to detect IR radiation in a frequency range, the IR photodetector device comprising:
   an electrically conductive layer;
   first and second vertical supports extending from the electrically conductive layer and defining a cavity therebetween and over the electrically conductive layer;
   a transparent electrically conductive layer carried by the first and second vertical supports and over the cavity, the transparent electrically conductive layer defining a gate electrode;
   a detector layer over the transparent electrically conductive layer and having a perforated pattern, the detector layer comprising a plurality of graphene layers intercalated with a plurality of ferric chloride layers;
   first and second electrically conductive contacts carried by the transparent electrically conductive layer on opposite sides of the detector layer; and
   circuitry coupled to the first and second electrically conductive contacts and the transparent electrically conductive layer and configured to receive a sensing signal for the detected IR radiation from first and second electrically conductive contacts, and generate a configuration signal for the gate electrode to control the frequency range of the detected IR radiation.

2. The IR photodetector device of claim 1 wherein the perforated pattern comprises an array of elliptical holes.

3. The IR photodetector device of claim 1 wherein the perforated pattern extends across only a portion of the detector layer.

4. The IR photodetector device of claim 3 wherein the perforated pattern extends over 45%-55% of the detector layer.

5. The IR photodetector device of claim 1 wherein the electrically conductive layer comprise at least one of gold, silver, and platinum.

6. The IR photodetector device of claim 1 wherein the first and second electrically conductive contacts respectively define a source electrode and a drain electrode.

7. The IR photodetector device of claim 1 wherein the detector layer comprises five graphene layers intercalated with two ferric chloride layers.

8. The IR photodetector device of claim 1 wherein the detected IR radiation comprises at least one of near-IR radiation and short-wave IR radiation.

9. The IR photodetector device of claim 1 wherein the detected IR radiation has a wavelength between 1.3 μm and 3 μm.

10. An infrared (IR) photodetector to detect IR radiation in a frequency range, the IR photodetector comprising:
   an electrically conductive layer;
   first and second vertical supports extending from the electrically conductive layer and defining a cavity therebetween and over the electrically conductive layer;
   a transparent electrically conductive layer carried by the first and second vertical supports and over the cavity, the transparent electrically conductive layer defining a gate electrode;
   a detector layer over the transparent electrically conductive layer and having a perforated pattern, the detector layer comprising a plurality of graphene layers intercalated with a plurality of ferric chloride layers; and
   first and second electrically conductive contacts carried by the transparent electrically conductive layer on opposite sides of the detector layer.

11. The IR photodetector of claim 10 wherein the perforated pattern comprises an array of elliptical holes.

12. The IR photodetector of claim 10 wherein the perforated pattern extends across only a portion of the detector layer.

13. The IR photodetector of claim 12 wherein the perforated pattern extends over 45%-55% of the detector layer.

14. The IR photodetector of claim 10 wherein the electrically conductive layer comprise at least one of gold, silver, and platinum.

15. The IR photodetector of claim 10 wherein the first and second electrically conductive contacts respectively define a source electrode and a drain electrode.

16. The IR photodetector of claim 10 wherein the detector layer comprises five graphene layers intercalated with two ferric chloride layers.

17. The IR photodetector of claim 10 wherein the detected IR radiation comprises at least one of near-IR radiation and short-wave IR radiation.

18. A method for making an infrared (IR) photodetector to detect IR radiation in a frequency range, the method comprising:
   forming first and second vertical supports extending from an electrically conductive layer and defining a cavity therebetween and over the electrically conductive layer;
   forming a transparent electrically conductive layer carried by the first and second vertical supports and over the cavity, the transparent electrically conductive layer defining a gate electrode;
   forming a detector layer over the transparent electrically conductive layer and having a perforated pattern, the detector layer comprising a plurality of graphene layers intercalated with a plurality of ferric chloride layers; and
   forming first and second electrically conductive contacts carried by the transparent electrically conductive layer on opposite sides of the detector layer.

19. The method of claim 18 wherein the perforated pattern comprises an array of elliptical holes.

20. The method of claim 18 wherein the perforated pattern extends across only a portion of the detector layer.

* * * * *